(12) United States Patent
Strickler et al.

(10) Patent No.: US 10,573,765 B2
(45) Date of Patent: Feb. 25, 2020

(54) APCVD OF DOPED TITANIUM OXIDE AND THE COATED ARTICLE MADE THEREBY

(71) Applicant: PILKINGTON GROUP LIMITED, Lathom (GB)

(72) Inventors: David A. Strickler, Toledo, OH (US); Yu Wang, Greensboro, NC (US); Jun Ni, Maumee, OH (US); Troy Darrell Manning, Ormskirk (GB)

(73) Assignee: Pilkington Group Limited, Lathom (GB)

( * ) Notice: Subject to any disclaimer, the term of this patent is extended or adjusted under 35 U.S.C. 154(b) by 123 days.

(21) Appl. No.: 15/838,686

(22) Filed: Dec. 12, 2017

(65) Prior Publication Data

US 2018/0166595 A1 Jun. 14, 2018

Related U.S. Application Data

(63) Continuation of application No. 13/261,804, filed as application No. PCT/US2012/048031 on Jul. 25, 2012, now abandoned.

(60) Provisional application No. 61/512,651, filed on Jul. 28, 2011.

(51) Int. Cl.
| | | |
|---|---|---|
| *H01L 31/0224* | (2006.01) | |
| *C03C 17/245* | (2006.01) | |
| *C23C 16/40* | (2006.01) | |
| *C23C 16/46* | (2006.01) | |
| *C23C 16/54* | (2006.01) | |
| *H01L 31/18* | (2006.01) | |

(52) U.S. Cl.
CPC .. *H01L 31/022425* (2013.01); *C03C 17/2456* (2013.01); *C23C 16/405* (2013.01); *C23C 16/46* (2013.01); *C23C 16/545* (2013.01); *H01L 31/022466* (2013.01); *H01L 31/1884* (2013.01); *C03C 2217/212* (2013.01); *C03C 2217/218* (2013.01); *C03C 2217/24* (2013.01); *C03C 2218/1525* (2013.01); *Y02E 10/50* (2013.01)

(58) Field of Classification Search
CPC .................................................. C23C 16/405
See application file for complete search history.

(56) References Cited

FOREIGN PATENT DOCUMENTS

JP 2005011737 A 1/2005

*Primary Examiner* — Joseph A Miller, Jr.
(74) *Attorney, Agent, or Firm* — Marshall & Melhorn, LLC

(57) ABSTRACT

A method of making a doped titanium oxide coating in a float glass manufacturing process and the coated glass article made thereby wherein the dopant is a niobium or tantalum compound. The doped titanium oxide coating preferably exhibits an electrical conductivity $>1\times10^{-3}$ S/cm.

7 Claims, No Drawings

APCVD OF DOPED TITANIUM OXIDE AND THE COATED ARTICLE MADE THEREBY

RELATED APPLICATIONS

This application is claiming the benefit under 35 U.S.C. § 119(e), of the provisional application filed Jul. 28, 2011 under 35 U.S.C. § 111(b), which was granted Ser. No. 61/512,651. This provisional application is hereby incorporated herein by reference in its entirety.

FIELD OF THE INVENTION

The present invention relates to a method of depositing an electrically conductive titanium oxide coating on a glass substrate, a coated article including an electrically conductive titanium oxide coating, and to a solar cell including such coated article.

BACKGROUND OF THE INVENTION

Demand for increasing efficiency in photovoltaic devices, such as solar cells is leading to investigation of strategies to obtain more electrical energy from known types of solar cells, such as amorphous silicon and cadmium-telluride (Cd—Te) devices. One area in which improvements may be beneficial is at the interface of the transparent conductive oxide (TCO) layer, and the so-called active layer, eg. amorphous silicon or Cd—Te. As the most commonly used TCO for solar cells is doped tin oxide, there are a number of reasons why the addition of a chemically stable, electrically conductive layer between the TCO and the active layer e.g. titanium oxide, may increase the conversion efficiency of a solar cell so constructed.

Enhancement of various properties of $TiO_2$ thin films has also been reported in the patent literature, for example:

U.S. Pat. No. 4,011,149 describes thin semiconducting electrodes of either single crystal, polycrystalline or amorphous materials. Preferred n-type anodic materials are said to include "suitably doped $TiO_2$".

U.S. Pat. No. 4,090,933 is a continuation-in-part of U.S. Pat. No. 4,011,149.

U.S. Pat. No. 4,524,091 describes a method of fabricating $TiO_2$ thick film photoanodes by screen printing multiple layers on a substrate, including two $TiO_2$ layers. The resulting structure is then treated to purportedly reduce the electrical resistivity of the printed films.

U.S. Pat. No. 5,028,568 describes an electrically conductive metal oxide particulate membrane having increased electrical conductivity due to utilization of a dopant in a sol-gel process, for example a niobium doped $TiO_2$ ceramic membrane.

U.S. Pat. No. 5,350,644 describes a photovoltaic cell comprising a light transmitting electrically conductive layer deposited on a glass plate or a transparent polymer sheet on which a series of $TiO_2$ layers have been applied. One or more of such $TiO_2$ layers may be doped with a divalent or trivalent metal ion.

U.S. Pat. No. 6,524,647 discloses application of a niobium doped tin oxide coating onto a glass substrate to produce a low-emissivity glass. The coating can optionally be doped with both niobium and other dopants, such as fluorine.

U.S. Pat. No. 6,524,750 describes a method for making a doped $TiO_2$ compound and the compound made thereby. The process, basically, involves mixing $TiO_2$ with an oxide of M (an element having an octagonal coordination structure), heating the mixture for a time and at a temperature sufficient to cause reaction of the $TiO_2$ and oxide of M to form a doped $TiO_2$ and subjecting the doped $TiO_2$ to a reducing atmosphere.

U.S. Pat. No. 6,720,202 describes a photovoltaic cell which includes a semiconductor layer of $TiO_2$ powders, consisting of porous particles of a particular size range and possessing a relatively high bulk density combined with high surface area.

U.S. Pat. No. 6,818,347 describes an alkaline battery cell including an electrolyte provided with an n-type metal oxide additive which improves electrochemical performance. The n-type metal oxide additive is either a doped metal oxide or a reduced metal oxide.

U.S. Pat. No. 7,037,589 describes niobium-titanium films, film stacks including one or more such niobium-titanium films and substrates bearing such films.

U.S. Pat. No. 7,169,733 describes a photocatalyst having first and second semiconductors wherein the first semiconductor may be, for example, nitrogen-doped or carbon-doped $TiO_2$, and the second semiconductor may be metal-doped $TiO_2$ each having increased oxidation or reduction potential upon irradiation by visible light.

WO2007/027498 discloses a multi-layer film stack including a light transmittance optimizing interlayer having a refractive index between 2.3 and 3.5, which may be $TiO_2$ and other suitable substoichiometric metal oxides.

EP 1796 107 describes a transparent conductor to be used in, for example, LCDs, solar cells, and electroluminescent electrodes. The transparent conductor includes a metal oxide of the form M:$TiO_2$ having an anatase-type crystal structure. The electrical conductivity of the transparent conductor is said to be increased while maintaining its transparency by replacing Ti atoms with another metal atom such as Nb, Ta, Mo, As, Sb, W or the like.

SUMMARY OF THE INVENTION

The present invention relates to a method of making a doped titanium oxide coating by atmospheric chemical vapor deposition during a float glass manufacturing process, as well as a coated glass article including such a doped titanium oxide coating. In a further aspect, the invention includes a solar cell including such coated glass article. Such a doped titanium oxide coating is preferably electrically conductive.

More specifically, the method of making the doped titanium oxide coating involves forming a uniform precursor gas mixture including the primary constituents of a halogenated, inorganic titanium compound, an organic oxygen containing compound, a halogenated inorganic niobium or tantalum compound and one or more inert carrier gases. As the halogenated, inorganic niobium or tantalum compound is intended to function only as a dopant in the precursor mixture, it comprises no more than 0.3 mol % thereof.

The precursor gas mixture is brought into film-forming proximity to the heated glass ribbon in the float glass manufacturing process. The heated glass ribbon is at a substantially higher temperature than the precursor gas mixture, the heat input from the glass ribbon causes the precursor gas mixture to chemically react so as to form a pyrolytic, doped titanium oxide coating on the glass ribbon at commercially viable deposition rates of greater than 35 Å/sec. The doped titanium oxide film preferably exhibits an electrical conductivity of greater than $1\times10^{-3}$ S/cm.

A coated glass article according to the invention has deposited thereon a titanium oxide coating doped with a halogenated niobium or tantalum compound, having a thickness between 500 Å and 1500 Å.

A solar cell according to the invention includes such a coated glass article as a component thereof.

DETAILED DESCRIPTION OF THE PREFERRED EMBODIMENTS

The present invention relates to a method of making a doped titanium oxide coating by atmospheric chemical vapor deposition during a float glass manufacturing process. The titanium oxide coating is preferably made electrically conductive by doping of the titanium compound as will be described in more detail hereinafter. While an electrically conductive titanium oxide coating may have other uses, it is thought to be particularly useful in photovoltaic devices, more particularly, solar cells.

As previously noted herein, in a typical solar cell a transparent conductive oxide (TCO) often overlays the so-called "active layer" of the solar cell, eg. a layer of amorphous silicon. Providing a layer of material having certain desirable properties at the interface of the TCO and the active layer is seen as a potential means of cost-effectively increasing the efficiency of conversion of solar radiation to electrical energy. Electrically conductive $TiO_2$ has been suggested as a good candidate for such an interface layer for several reasons, including at least: (1) that the $TiO_2$ is chemically and thermally stable enough that the active layer can be deposited directly onto it; (2) due to its refractive index (between 2.5 and 3.5) in combination with the refractive indices of adjacent layers, it would reduce the amount of light lost due to reflection and (3) it could help protect the TCO from deterioration upon deposition of the active layer, especially an active layer of amorphous silicon.

It is also important that while the $TiO_2$ layer need not be highly conductive, that it be at least as electrically conductive as the active layer so as not to form a barrier to electrical current flow between the TCO and the active layer.

In order to realize the benefit of an electrically conductive TiO2 interface layer, it must be possible to produce such an electrically conductive coating in large volume and at a cost sufficiently low to make it commercially viable in large-scale solar cell manufacturing processes. Applicants submit that the invention meets, in an unexpected way, these and other needs that will be appreciated by those skilled in the art.

Initially, a combination of gaseous reactants, namely a halogenated, inorganic titanium compound and an organic oxygen-containing compound may be provided. Suitable inorganic titanium compounds include: $TiCl_4$, $TiBr_4$, and $TiI_4$. Suitable organic oxygen-containing compounds include: ethyl acetate, n-butyl acetate, isobutyl acetate, sec-butyl acetate, propyl acetate and other esters and ethers. One or more inert carrier gases may be utilized as a component of the gaseous mixture, for example, nitrogen, hydrogen, helium, or mixtures thereof.

In order to make the proposed $TiO_2$ layer electrically conductive, a gaseous halogenated, inorganic niobium dopant compound is preferred, although tantalum compounds may also be considered. Suitable halogenated, inorganic dopant compounds include: $NbCl_5$, $NbF_5$, $TaCl_5$ and $TaF_5$. The applicants have found that addition of niobium or tantalum dopant compounds to the gaseous precursor mixture at a level of no more than 0.3 mol % is sufficient to provide the desired level of electrical conductivity. Correlation of Nb or Ta doping efficiency of the titanium oxide coating to the electrical conductivity of the coating is an aspect of the invention.

Niobium has been found to be a particularly suitable dopant for $TiO_2$, both because Nb atoms are of an appropriate size to fit within the $TiO_2$ matrix, and because of its usual valence state of $Nb^{+5}$. Use of Nb compounds having valence states besides +5 may be possible in connection with the invention. Applicants have found that electrical conductivity of greater than $1 \times 10^{-3}$ Siemens/cm can be induced in $TiO_2$ in online production of pyrolytic thin films by APCVD as described herein.

The doped $TiO_2$ film can be deposited by APCVD directly on a hot glass substrate, but is preferably deposited as part of a multi-layer film stack for solar cell purposes. For example, the subject doped $TiO_2$ coating may be deposited over a preexisting film stack comprising doped $SnO_2$ over thin layers of silica and undoped $SnO_2$. A glass coated with such a preexisting film stack is sold by Pilkington North America, Inc. as its TEC™ line of products.

As previously mentioned, the doped $TiO_2$ layer, when utilized at the interface of the TCO and the active layer, reduces the reflection of solar radiation. Such loss of solar radiation due to reflection has been found to be reduced by between 0.5% and 2.0%.

In consideration of the various benefits of the doped $TiO_2$ interfacial layer in a solar cell, applicants have found that a relative increase in conversion efficiency of between 7% and 12% can be expected in a typical thin film silicon solar cell.

For some applications of the present invention, it may be desirable to suppress iridescence effects which can occur when light is reflected from, or transmitted through, a filmed glass substrate. In connection with the present invention, any suitable single layer or multi-layer color suppression film stack may be utilized, including a single metal oxide layer, a metal oxide layer and silica layer, or a gradient coating layer.

In a preferred embodiment, a metal oxide layer and a silica layer together form an excellent color suppression film stack, as is known from for example, Gordon U.S. Pat. Nos. 4,377,613, and 4,419,386, which are herein incorporated by reference. The color suppression film stack is deposited on the substrate material, prior to deposition of the electrically conductive metal oxide layer. The color suppression film stack is relatively thin, the tin oxide layer having a thickness of 250-600 Å, and the silica layer having a thickness of 250-350 Å.

A solar cell including a coated glass article according to the invention may be a single sheet of a glass substantially transparent to solar radiation. A photoactive material such as titanium oxide, cadmium/telluride, amorphous silicon, and crystalline silica is preferably disposed on the first major surface of the glass substrate, i.e. the major substrate surface in closest proximity to a direct source of solar radiation. The titanium oxide layer may be one component of a multi-layer film stack deposited by any suitable method, including various CVD and sputter coating technologies on the glass substrate.

To practice the APCVD method of film deposition, a uniform gaseous mixture comprising a halogenated inorganic titanium compound, a halogenated inorganic niobium or tantalum dopant compound, an organic oxygen-containing compound and one or more inert carrier gases, is maintained at a temperature below that at which it reacts to form the material to be deposited, and is delivered to a location near a flat glass substrate to be coated, the substrate being at a temperature above the reaction temperature of the reactants. The precursor gas mixture is thereafter introduced into the vapor space directly over the substrate. The heat from the substrate raises the temperature of the precursor gas above the thermal decomposition temperature of the precursor compounds.

High deposition rates are important from a commercial standpoint when coating substrates in a manufacturing process. This is particularly true for an on-line float glass process, where the glass ribbon is traveling at a predetermined line speed and where a specified coating thickness must be achieved in a matter of seconds.

A float glass installation is utilized as a means for practicing the method of the present invention. One specific example of a float glass installation is hereinafter described. The float glass apparatus more particularly comprises a canal section along which molten glass is delivered from a melting furnace, to a float bath section wherein a continuous glass ribbon is formed in accordance with the well-known float process. The glass ribbon advances from the bath section through an adjacent annealing lehr and a cooling section. The continuous glass ribbon serves as the substrate upon which the desired coating is deposited in accordance with the present invention. Temperatures in the float bath section are typically in the range of 1050 F (566 C) and 1350 F (732 C).

The float section includes a bottom section within which a bath of molten tin is contained, a roof, opposite sidewalls, and end walls. The roof, side walls, and end walls together define an enclosure in which a non-oxidizing atmosphere is maintained to prevent oxidation of the molten tin.

Additionally, gas distributor beams are preferably located in the bath section, although other locations, such as the lehr or the lehr gap may be possible. The gas distributor beams, preferably located in the bath section may be employed to apply additional coatings onto the substrate prior to applying the metal oxide coating by the method of the present invention. The additional coatings may include silicon and silica.

In operation, the molten glass flows along the channel beneath a regulating tweel and downwardly onto the surface of the tin bath in controlled amounts. On the tin bath the molten glass spreads laterally under the influences of gravity and surface tension, as well as certain mechanical influence, and it is advanced across the bath to form the ribbon. The ribbon is removed over lift out rolls and is thereafter conveyed through the annealing lehr and the cooling section on aligned rolls. The application of the coating of the present invention may take place in the float bath section, or further along the production line, for example, in the gap between the float bath and the annealing lehr, or in the annealing lehr.

A suitable non-oxidizing atmosphere, generally nitrogen, or a mixture of nitrogen and hydrogen in which nitrogen predominates, is maintained in the bath enclosure to prevent oxidation of the tin bath. The atmosphere gas is admitted through conduits operably coupled to a distribution manifold. The non-oxidizing gas is introduced at a rate sufficient to compensate for normal losses and maintain a slight positive pressure, on the order of about 0.001 to about 0.01 atmosphere above ambient atmospheric pressure, so as to prevent infiltration of outside atmosphere. For purposes of the present invention the above-noted pressure range is considered to constitute normal atmospheric pressure. Heat for maintaining the desired temperature regime in the tin bath and the enclosure may be provided by radiant heaters within the enclosure. The atmosphere within the lehr is typically atmospheric air, as the cooling section is not enclosed and the glass ribbon is open to the ambient atmosphere. Ambient air may be directed against the glass ribbon, for example, by fans, in the cooling section. Heaters may also be provided within the annealing lehr for causing the temperature of the glass ribbon to be gradually reduced in accordance with a predetermined regime as it is conveyed therethrough.

Gas distributor beams are generally positioned in the float bath to deposit the various coatings on the glass ribbon substrate but might be positioned downstream of the float bath. The gas distributor beam is one form of reactor that can be employed in practicing the process of the present invention.

A conventional configuration for the distributor beams suitable for supplying the precursor materials in accordance with the invention is, generally, an inverted generally channel-shaped framework formed by spaced inner and outer walls and defining at least two enclosed cavities. A suitable heat exchange medium is circulated through the enclosed cavities in order to maintain the distributor beams at a desired temperature. A preferred distributor beam is disclosed in U.S. Pat. No. 4,504,526 to Hofer et al., which is incorporated herein by reference.

The precursor gas mixture is supplied through a fluid-cooled supply conduit. The supply conduit extends along the distributor beam and admits the gas through drop lines spaced along the supply conduit. The supply conduit leads to a delivery chamber within a header carried by the framework. Precursor gases admitted through the drop lines are discharged from the delivery chamber through a passageway toward a coating chamber defining a vapor space opening onto the glass where they flow along the surface of the glass.

Baffle plates may be provided within the delivery chamber for equalizing the flow of precursor materials across the distributor beam to assure that the materials are discharged against the glass in a smooth, laminar, uniform flow entirely across the distributor beam. Spent precursor materials are collected and removed through exhaust chambers along the sides of the distributor beam.

Various forms of distributor beams used for chemical vapor deposition are suitable for the present method and are known in the prior art.

One such alternative distributor beam configuration generally introduces the precursor gas mixture through a gas supply duct where it is cooled by cooling fluid circulated through cooling ducts. The gas supply duct opens through an elongated aperture into a gas flow restrictor.

The gas flow restrictor comprises a plurality of metal strips longitudinally crimped in the form of a sine wave and vertically mounted in abutting relationship with one another extending along the length of the distributor. Adjacent crimped metal strips are arranged "out of phase" to define a plurality of vertical channels between them. These vertical channels are of small cross-sectional area relative to cross-sectional area of the gas supply duct, so that the gas is released from the gas flow restrictor at substantially constant pressure along the length of the distributor.

The coating gas is released from the gas flow restrictor into the inlet side of a substantially U-shaped guide channel generally comprising an inlet leg, a coating chamber which opens onto the hot glass substrate to be coated, and an exhaust leg, whereby used coating gas is withdrawn from the glass. The rounded corners of the blocks defining the coating channel promote a uniform laminar flow of coating parallel to the glass surface across the glass surface to be coated.

EXAMPLES

The following examples, which constitute the best mode presently contemplated by the inventors for practicing the invention, are presented solely for the purpose of further illustrating and disclosing the present invention, and are not to be construed as a limitation on the invention.

Comparative Examples 1-5 show that with an inorganic titanium precursor and an organic oxygen containing compound in an APCVD process, titanium oxide coatings at commercially viable thicknesses and deposition rates can be deposited. These coatings, however, cannot be said to be electrically conductive to any practically useful level. Accordingly, these coatings are not useful within the scope of the present invention.

Examples 1-4 according to the invention are included in Table 2. In addition to vaporized $TiCl_4$, and EtOAc, vaporized $NbF_5$ was added to the gaseous precursor mixture in amounts of 0.07-0.17 mol %. It will be noted that no molecular oxygen was utilized in Examples 1-4. Additionally, the films were deposited in an atmosphere of primarily nitrogen at essentially atmospheric pressure. Temperatures at the substrate surface during deposition were varied between 550 C and 650 C.

The results are shown in Table 1, herein.

TABLE 1

Comparative Examples

| Example | Ti precursor | Ti concentration (mol %) | Ethyl acetate (mol %) | $O_2$ (mol %) | $NbF_5$ (mol %) | Total gas flow (slm) | Line Speed (ipm) | Sheet Resistance (ohm/sq) | Resisitivity (ohm-cm) | Conductivity (S/cm) | Thickness (Å) | Deposition Rate (Å/s) |
|---|---|---|---|---|---|---|---|---|---|---|---|---|
| C1 | $TiCl_4$ | 0.62 | 1.23 | 0 | 0 | 27 | 150 | 1.97E+12 | 1.15E+07 | 8.70E−08 | 592 | 91 |
| C2 | $TiCl_4$ | 0.31 | 0.92 | 1.7 | 0 | 27 | 150 | 5.44E+13 | 1.68E+08 | 5.97E−09 | 308 | 48 |
| C3 | $TiCl_4$ | 0.31 | 0.92 | 0 | 0 | 27 | 150 | 2.02E+12 | 1.01E+07 | 9.90E−08 | 500 | 78 |
| C4 | $TiCl_4$ | 0.62 | 1.84 | 1.7 | 0 | 27 | 150 | 2.32E+13 | 7.97E+07 | 1.25E−08 | 344 | 54 |
| C5 | $TiCl_4$ | 0.31 | 0.61 | 3.3 | 0 | 27 | 150 | 5.99E+12 | 2.01E+07 | 4.98E−08 | 335 | 52 |

TABLE 2

Examples according to the Invention

| Example | Ti precursor | Ti concentration (mol %) | Ethyl acetate (mol %) | $O_2$ (mol %) | $NbF_5$ (mol %) | Total gas flow (slm) | Line Speed (ipm) | Sheet Resistance (ohm/sq) | Resisitivity (ohm-cm) | Conductivity (S/cm) | Thickness (Å) | Deposition Rate (Å/s) |
|---|---|---|---|---|---|---|---|---|---|---|---|---|
| 1 | $TiCl_4$ | 0.52 | 2.34 | 0 | 0.07 | 21 | 47 | 5.14E+06 | 2.83E+01 | 3.54E−02 | 550 | 37 |
| 2 | $TiCl_4$ | 0.65 | 2.32 | 0 | 0.17 | 21 | 47 | 4.74E+05 | 6.35E+00 | 1.57E−01 | 1340 | 89 |
| 3 | $TiCl_4$ | 0.72 | 2.32 | 0 | 0.17 | 21 | 47 | 7.14E+04 | 1.02E+00 | 9.79E−01 | 1430 | 95 |
| 4 | $TiCl_4$ | 0.50 | 2.34 | 0 | 0.07 | 21 | 47 | 3.80E+05 | 4.45E+00 | 2.25E−01 | 1170 | 78 |

The thickness of the films formed ranged from 550 Å to 1430 Å, substantially greater than the undoped films of the Comparative Examples. Deposition rates ranged from 37-95 Å/sec, which while not substantially greater than the Comparative Examples, are still useful deposition rates. Significantly, however, the conductivity of the films was greatly increased over those of the Comparative Examples, in particular to a range of from 3.54E-02 S/cm to 9.79E-01 S/cm. These conductivity levels are in a range to be useful in improving performance of photovoltaic devices for the reasons previously noted herein.

From the foregoing disclosure and detailed description of certain preferred embodiments, it will be apparent that various modifications, additions and other alternative embodiments are possible without departing from the true scope and spirit of the invention. The embodiments discussed were chosen and described to provide the best illustration of the principles of the invention and its practical application to thereby enable one of ordinary skill in the art to use the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of making a doped conductive titanium oxide coating by atmospheric chemical vapor deposition during a float glass manufacturing process comprising:
   providing a heated glass ribbon in the float glass manufacturing process;
   providing a uniform precursor gas mixture comprising $TiCl_4$, a halogenated, inorganic niobium or tantalum dopant compound, ethyl acetate and one or more inert carrier gases, wherein the halogenated, inorganic niobium or tantalum dopant compound comprises no more than 0.3 mol % of the precursor gas mixture;
   delivering the precursor gas mixture at a temperature below the thermal decomposition temperature of the precursor gas mixture to a location adjacent the heated glass ribbon to be coated, a float bath atmosphere surrounding the heated glass ribbon being at essentially atmospheric pressure; and
   bringing the precursor gas mixture into coating contact with the heated glass ribbon, the temperature of the heated glass ribbon being at a temperature of 1050° F. (566° C.)-1350° F. (732° C.) and sufficient to cause reaction of the precursor gas mixture so as to deposit a doped titanium oxide coating at a deposition rate greater than 35 Å/sec. on the glass ribbon, the doped titanium oxide coating exhibiting an electrical conductivity of greater than $1 \times 10^{-3}$ S/cm.

2. The method defined in claim 1, wherein the halogenated inorganic dopant compound comprises one chosen from the group consisting of: $NbF_5$, $NbCl_5$, $TaF_5$, and $TaCl_5$.

3. The method defined in claim 2, wherein the halogenated inorganic dopant compound comprises $NbF_5$.

4. The method defined in claim 2, wherein the precursor mixture comprises no more than 0.3 mol % $NbF_5$.

5. The method defined in claim 1, wherein the deposition rate of the doped titanium oxide is greater than 75 Å/sec.

6. The method defined in claim 1, wherein the conductivity exhibited by the doped titanium oxide coating is more than $3.54E^{-2}$ S/cm.

7. The method defined in claim 1, wherein the inert carrier gas is comprised of one or more of He, N, $H_2$ and mixtures thereof.

\* \* \* \* \*